(12) United States Patent
Kawana et al.

(10) Patent No.: US 9,601,315 B2
(45) Date of Patent: Mar. 21, 2017

(54) MULTIPLE CHARGED PARTICLE BEAM LITHOGRAPHY APPARATUS AND MULTIPLE CHARGED PARTICLE BEAM PATTERN WRITING METHOD

(71) Applicant: NuFlare Technology, Inc., Yokohama (JP)

(72) Inventors: Ryoh Kawana, Yokohama (JP); Yasuo Kato, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/944,640

(22) Filed: Nov. 18, 2015

(65) Prior Publication Data

US 2016/0155610 A1 Jun. 2, 2016

(30) Foreign Application Priority Data

Nov. 28, 2014 (JP) ................................. 2014-240857

(51) Int. Cl.
H01J 37/317 (2006.01)
(52) U.S. Cl.
CPC ... *H01J 37/3177* (2013.01); *H01J 2237/0437* (2013.01); *H01J 2237/31761* (2013.01)
(58) Field of Classification Search
CPC .................. H01J 37/3177; H01J 37/31761
See application file for complete search history.

(56) References Cited

U.S. PATENT DOCUMENTS

| 2013/0056647 A1 | 3/2013 | Yoshikawa et al. |
| 2013/0256519 A1 | 10/2013 | Kato et al. |
| 2013/0320230 A1 | 12/2013 | Yoshikawa et al. |

FOREIGN PATENT DOCUMENTS

| JP | 2013-55144 | 3/2013 |
| JP | 2014-7379 | 1/2014 |
| KR | 10-2013-0110034 | 10/2013 |
| KR | 10-2013-0135772 | 12/2013 |
| TW | 201351055 A | 12/2013 |

OTHER PUBLICATIONS

Office Action issued Aug. 31, 2016 in Korean Patent Application No. 10-2015-0165487 (with English transaltion).
Office Action issued Dec. 16, 2016 in Taiwanese Patent Application No. 104133697 (with English language translation).

*Primary Examiner* — Wyatt Stoffa
*Assistant Examiner* — Eliza Osenbaugh-Stewart
(74) *Attorney, Agent, or Firm* — Oblon, McClelland, Maier & Neustadt, L.L.P.

(57) ABSTRACT

A multiple charged particle beam lithography apparatus includes a weighting coefficient operation unit to operate a plurality of weighting coefficients that assign weights to doses of a plurality of different beams used for multiple pattern writing for each pixel of pixels, the each pixel being used as an irradiation unit region per beam of multiple charged particle beams; a dose operation processing circuitry to operate doses of the plurality of different beams weighted by using a corresponding weighting coefficient among the plurality of weighting coefficients for each of the pixels; and a writing mechanism that writes a pattern on a target object using the multiple charged particle beams such that corresponding pixels are irradiated with the plurality of different beams of the doses weighted respectively.

10 Claims, 16 Drawing Sheets n-th Pass n-th Pass

1 Pass

2 Pass

3 Pass

4 Pass

1 Pass

2 Pass

3 Pass

4 Pass $|\overrightarrow{\Delta r_{offset}}|=0.1$ $|\overrightarrow{\Delta r_{offset}}|=0.5$ $|\overrightarrow{\Delta r_{offset}}|=1.0$ $|\overrightarrow{\Delta r_{offset}}|=5.0$

MULTIPLE CHARGED PARTICLE BEAM LITHOGRAPHY APPARATUS AND MULTIPLE CHARGED PARTICLE BEAM PATTERN WRITING METHOD

CROSS-REFERENCE TO RELATED APPLICATION

This application is based upon and claims the benefit of priority from prior Japanese Patent Application No. 2014-240857 filed on Nov. 28, 2014 in Japan, the entire contents of which are incorporated herein by reference.

BACKGROUND OF THE INVENTION

Field of the Invention

Embodiments described herein relate generally to a multiple charged particle beam lithography apparatus and a multiple charged particle beam pattern writing method and, for example, relate to a method of correcting a positional displacement or a dimensional displacement of a pattern caused by a positional displacement of a beam in multiple beams pattern writing by modulating a dose.

Related Art

A lithography technique which leads development of micropatterning of a semiconductor device is a very important process for exclusively generating a pattern in semiconductor manufacturing processes. In recent years, with an increase in integration density of an LSI, a circuit line width required for semiconductor devices is getting smaller year by year. An electron beam pattern writing technique has inherently superior resolution and a mask pattern is written to mask blanks using an electron beam.

For example, a lithography apparatus using multiple beams is known. Compared with a case in which one electron beam is used, many beams can be emitted at a time by using multiple beams so that throughput can be improved significantly. In such a lithography apparatus of multiple beams mode, for example, an electron beam emitted from an electron gun assembly is passed through a mask having a plurality of holes to form multiple beams, each beam is subjected to blanking control, and each beam that is not shielded is reduced by an optical system to reduce a mask image and deflected by a deflector before being shot at a predetermined position on a target object.

Here, in multiple beams pattern writing, a positional displacement of beam could arise due to a distortion of the optical system, a displacement of an aperture plate array to form multiple beams from design values, and/or the Coulomb effect. If a positional displacement of a beam constituting multiple beams arises, a problem that a written pattern also has a positional displacement or a dimensional displacement arises. Therefore, it is desirable to correct positional displacement and dimensional displacement of a pattern formed with a positionally-displaced beam being irradiated. For a positional displacement caused by an optical strain, for example, operating a shot position containing a distortion portion for a positional displacement caused by an optical strain to adjust the dose of a beam with which the shot position is irradiated in accordance with pattern area density positioned in a region constituted by assuming the shot position containing the distortion portion is proposed (see Published Unexamined Japanese Patent Application No. 2014-007379 (JP-A-2014-007379), for example).

However, a sufficiently effective technique to correct positional displacement and dimensional displacement of a pattern formed by being irradiated with a positionally-displaced beam is not yet established.

BRIEF SUMMARY OF THE INVENTION

According to one aspect of the present invention, a multiple charged particle beam lithography apparatus includes:

a weighting coefficient operation processing circuitry configured to operate a plurality of weighting coefficients that assign weights to doses of a plurality of different beams used for multiple pattern writing for each pixel of pixels, the each pixel being used as an irradiation unit region per beam of multiple charged particle beams;

a dose operation processing circuitry configured to operate doses of the plurality of different beams weighted by using a corresponding weighting coefficient among the plurality of weighting coefficients for each of the pixels; and a writing mechanism, including a charged particle source, a deflector and a stage on which a target object is placed, configured to write a pattern on the target object using the multiple charged particle beams such that corresponding pixels are irradiated with the plurality of different beams of the doses weighted respectively.

According to another aspect of the present invention, a multiple charged particle beam pattern writing method includes:

operating a plurality of weighting coefficients that assign weights to doses of a plurality of different beams used for multiple pattern writing for each pixel of pixels, the each pixel being used as an irradiation unit region per beam of multiple charged particle beams;

operating doses of the plurality of different beams weighted by using a corresponding weighting coefficient among the plurality of weighting coefficients for each of the pixels; and writing a pattern on a target object using the multiple charged particle beams such that corresponding pixels are irradiated with the plurality of different beams of the doses weighted respectively.

DETAILED DESCRIPTION OF THE INVENTION

In the embodiments described below, multiple charged particle beam lithography apparatuses and pattern writing methods capable of correcting positional displacement and dimensional displacement of a pattern formed by being irradiated with multiple beams containing a positionally-displaced beam will be described.

In the embodiments described below, the configuration using an electron beam will be described as an example of a charged particle beam. However, the charged particle beam is not limited to an electron beam, and a beam such as an ion beam using charged particles may also be used.

Embodiment 1

Figure 1:
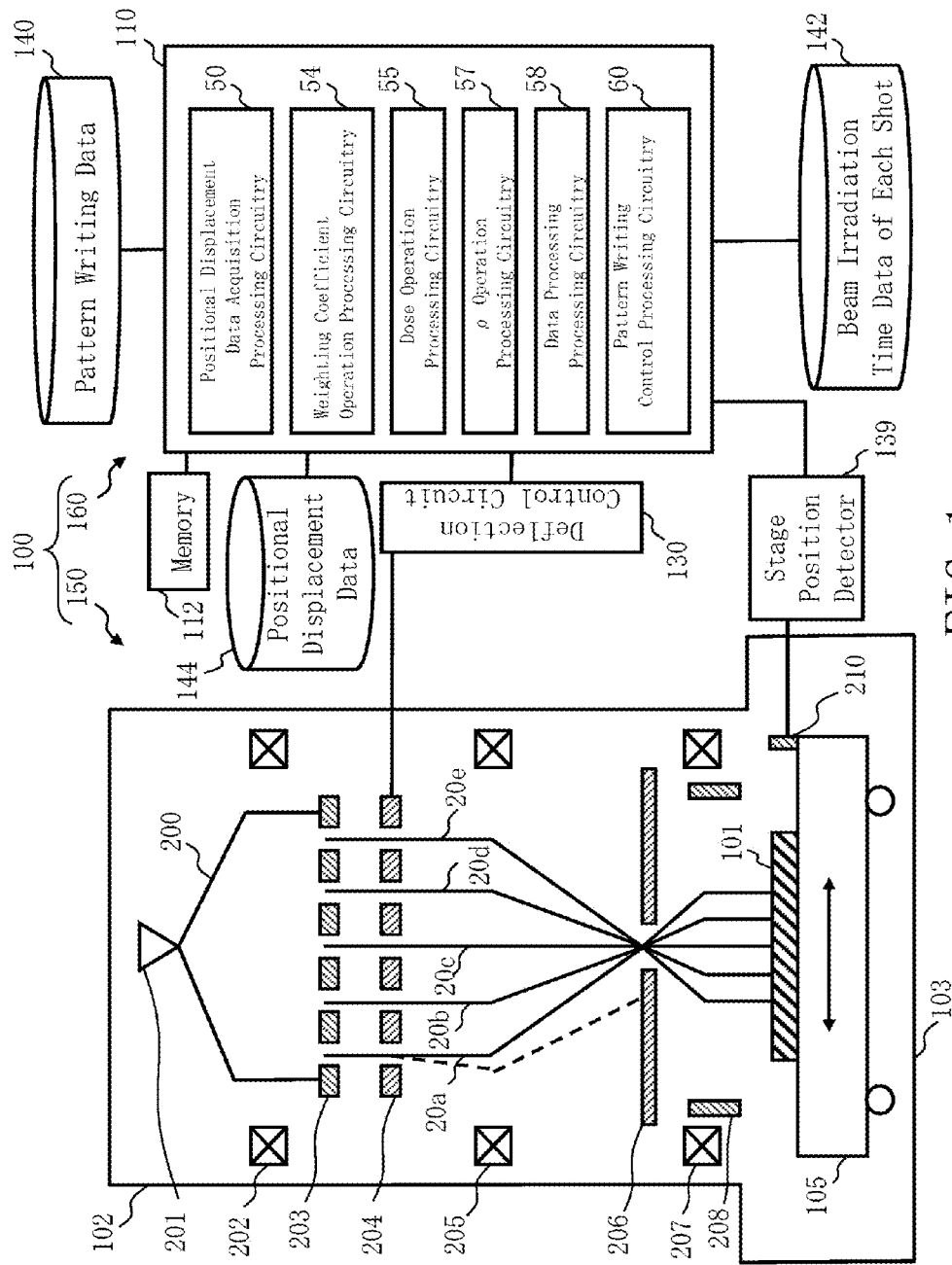
FIG. 1 is a conceptual diagram showing the configuration of a lithography apparatus according to Embodiment 1.

FIG. 1 is a conceptual diagram showing the configuration of a lithography apparatus according to Embodiment 1. In FIG. 1, a lithography apparatus 100 includes a writing mechanism 150 and a controller 160. The lithography apparatus 100 is an example of the multiple charged particle beam lithography apparatus. The writing mechanism 150 includes an electron optical column 102 and a pattern writing chamber 103. Inside the electron optical column 102, an electron gun assembly 201, an illumination lens 202, a shaping aperture array member 203, a blanking aperture array member 204, a reducing lens 205, a limiting aperture plate member 206, an objective lens 207, and a deflector 208 are arranged. The XY stage 105 is arranged inside the pattern writing chamber 103. A target object 101 such as mask blanks to be a substrate intended for pattern writing while a pattern is written is arranged on the XY stage 105. The target object 101 includes an exposure mask for manufacturing semiconductor devices or a semiconductor substrate (silicon wafer) on which semiconductor devices are manufactured. Further, a mirror 210 for position measurement of the XY stage 105 is arranged on the XY stage 105.

The controller 160 includes a control computer 110, a memory 112, a deflection control circuit 130, a stage position detector 139, and storage devices 140, 142, 144 such as magnetic disk drives. The control computer 110, the memory 112, the deflection control circuit 130, the stage position detector 139, and the storage devices 140, 142, 144 are mutually connected via a bus (not shown). The storage device 140 (data storage unit) stores pattern writing data input from outside.

Inside the control computer 110, a positional displacement data acquisition processing circuitry 50, a weighting coefficient operation processing circuitry 54, a dose operation processing circuitry 55, a pattern area density ρ operation processing circuitry 57, a data processing circuitry 58, and a pattern writing control processing circuitry 60 (pattern writing controller) are arranged. Each of the processing circuitries includes an electric circuit, a quantum circuit, a computer, a processor, a circuit board, or a semiconductor device, for example. Each of the processing circuitries may use the common processing circuitry (same processing circuitry), or may use different processing circuitries (separated processing circuitries). Information input into or output from the positional displacement data acquisition processing circuitry 50, the weighting coefficient operation processing circuitry 54, the dose operation processing circuitry 55, the pattern area density ρ operation processing circuitry 57, the data processing circuitry 58, and the pattern writing control processing circuitry 60 and information during operation are stored in the memory 112 each time.

Here, in FIG. 1, only the configuration needed to describe Embodiment 1 is shown. Other configurations normally needed for the lithography apparatus 100 may also be included.

Figure 2A:
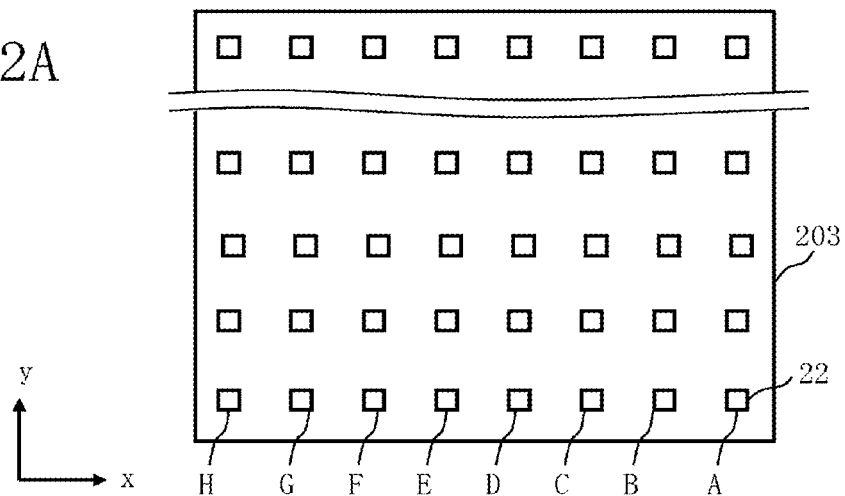
FIGS. 2A and 2B are conceptual diagrams showing the configuration of a molding aperture plate array member according to Embodiment 1.
Figure 2B:
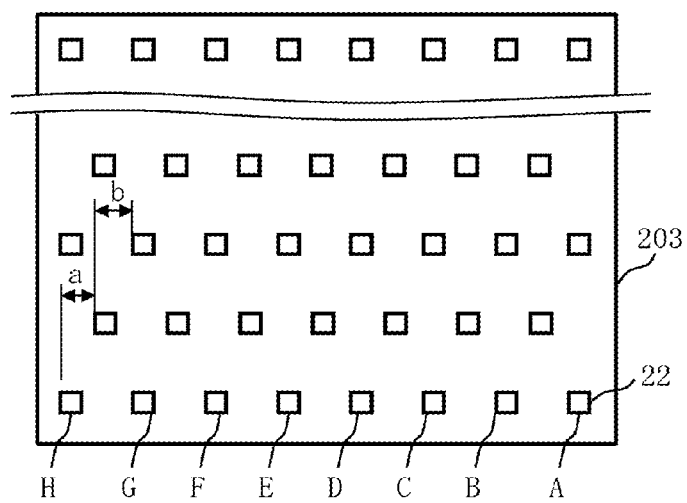

FIGS. 2A and 2B are conceptual diagrams showing the configuration of a molding aperture plate array member according to Embodiment 1. In FIG. 2A, the shaping aperture array member 203 has holes (openings) 22 of m rows high (y direction)×n rows wide (x direction) (m, n≥2) formed with predetermined arrangement pitches in a matrix of rows and columns. In FIG. 2A, for example, the 512×8 holes 22. Each of the holes 22 is formed in a rectangular shape of the same dimensions. Alternatively, each of the holes 22 may be formed in a circular shape of the same outside diameter. Here, an example in which the eight holes 22 from A to H are formed in the x direction for each row in the y direction is shown. Multiple beams 20 are formed by a portion of an electron beam 200 being passed through a plurality of these holes 22. Here, an example in which the holes 22 of two rows or more are arranged both vertically and horizontally (x, y directions) is shown, but the present embodiment is not limited to such an example. In addition, for example, a plurality of rows may be arranged vertically or horizontally (x or y direction) and only one row may be arranged in the other direction. Also, the method of arranging the holes 22 is not limited to a case of arranging holes in a grid-like shape like in FIG. 2A. For example, as shown in FIG. 2B, the first row and the second row in the vertical direction (y direction) may be arranged by being shifted by a dimension a in the horizontal direction (x direction) from each other. Similarly, the second row and the third row in the vertical direction (y direction) may be arranged by being shifted by a dimension b in the horizontal direction (x direction) from each other.

Figure 3:
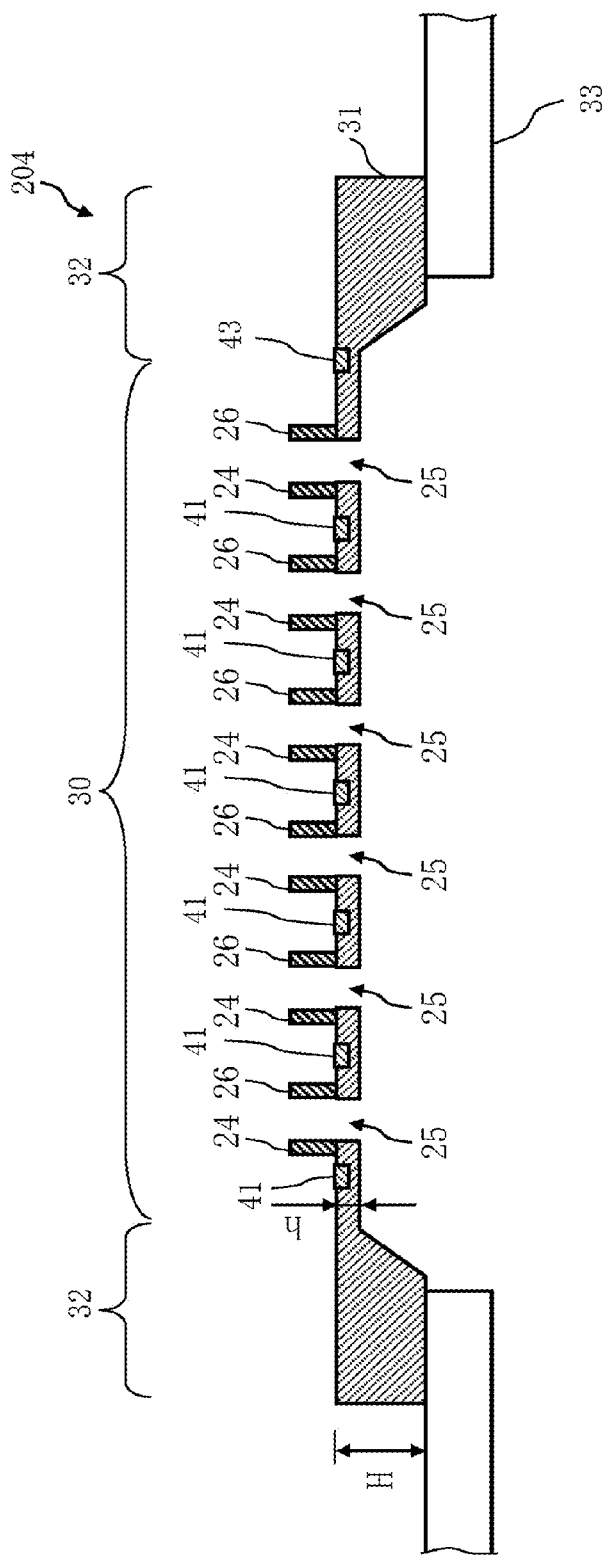
FIG. 3 is a sectional view showing the configuration of a blanking aperture plate array member according to Embodiment 1.

FIG. 3 is a sectional view showing the configuration of a blanking aperture plate array member according to Embodiment 1.

Figure 4:
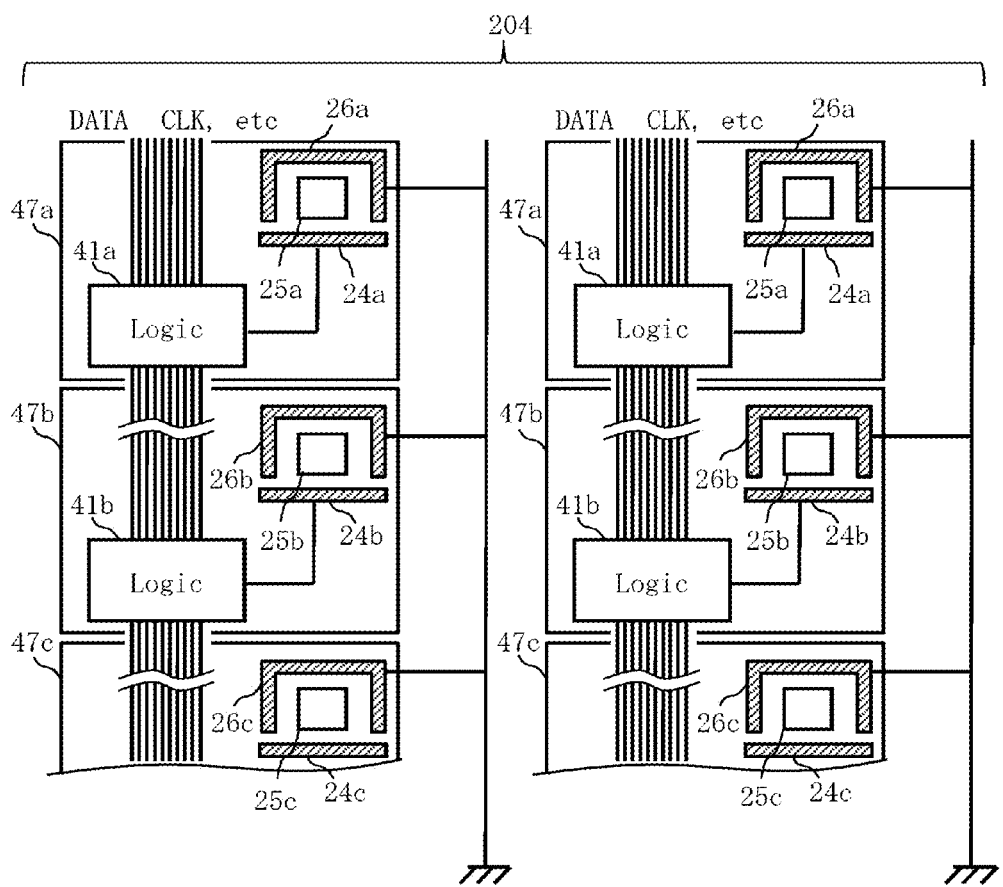
FIG. 4 is a top conceptual diagram showing a portion of the configuration in a membrane region of the blanking aperture plate array member according to Embodiment 1.

FIG. 4 is a top conceptual diagram showing a portion of the configuration in a membrane region of the blanking aperture plate array member according to Embodiment 1. In FIGS. 3 and 4, the physical relationship among a control electrode 24, a counter electrode 26, and control circuits 41, 43 does not correspond to the actual physical relationship. The blanking aperture array member 204 has, as shown in FIG. 3, a semiconductor substrate 31 made of silicon and the like arranged on a fulcrum 33. The center portion of the substrate 31 is, for example, thinly cut from the back side and processed into a membrane region 30 (first region) of a thin thickness h. The periphery surrounding the membrane region 30 is an outer circumferential region 32 (second region) of a thick thickness H. The top surface of the membrane region 30 and the top surface of the outer circumferential region 32 are formed so as to have the same height or substantially the same height. The substrate 31 is held on the fulcrum 33 by the back side of the outer circumferential region 32. The center portion of the fulcrum 33 is open and the membrane region 30 is positioned in a region where the fulcrum 33 is open.

The membrane region 30 has a passing hole 25 (for example, 25a to 25c) (opening) for passing of each beam of multiple beams (multiple charged particle beams) opened in a position corresponding to each of the holes 22 of the shaping aperture array member 203 shown in FIGS. 2A and 2B. Then, as shown in FIGS. 3 and 4, a pair (blanker: blanking deflector) of the control electrode 24 (for example, 24a to 24c) and the counter electrode 26 (for example, 26a to 26c) for blanking deflection is arranged in the membrane region 30 across the passing hole 25 corresponding to a neighborhood position of each of the passing holes 25. Also, the control circuit 41 (for example, 41a and 41b) (logic circuit) that applies a deflecting voltage to the control electrode 24 for each of the passing holes 25 is arranged in the neighborhood of each of the passing holes 25 in the membrane region 30. The counter electrode 26 for each beam is ground-connected.

Also, as shown in FIG. 4, for example, a 10-bit parallel wire for control signal is connected to each of the control circuits 41. In addition to, for example, the 10-bit parallel wire, a clock signal line and a power wire are connected to each of the control circuits 41. A portion of the parallel wire may be used for the clock signal line or the power wire. An individual blanking mechanism 47 (for example, 47a to 47c) by the control electrode 24, the counter electrode 26, and the control circuit 41 is configured for each beam constituting multiple beams. In the example of FIG. 3, the control electrode 24, the counter electrode 26, and the control circuit 41 are arranged in the membrane region 30 where the thickness of the substrate 31 is thin. However, the present embodiment is not limited to such an example.

The electron beam 20 passing through each of the passing holes 25 is deflected by voltages of the two electrodes 24, 26 forming a pair applied independently. Blanking control is exercised by such deflection. In other words, a pair of the control electrode 24 and the counter electrode 26 deflects by blanking a corresponding beam of multiple beams having passed through a plurality of the holes 22 (openings) of the shaping aperture array member 203.

Next, the operation of the writing mechanism 150 in the lithography apparatus 100 will be described. The electron beam 200 emitted from the electron gun assembly 201 (a charged particle source) illuminates the entire shaping aperture array member 203 almost vertically through the illumination lens 202. The shaping aperture array member 203 has a plurality of rectangular holes (openings) formed therein and the electron beam 200 illuminates a region all the plurality of holes. A plurality of electron beams (multiple beams) 20a to 20e in, for example, a rectangular shape is formed by a portion of each of the electron beams 200 with which the positions of the plurality of holes are irradiated being passed through each of the plurality of holes of the shaping aperture array member 203. The multiple beams 20a to 20e pass through the respective blankers (first deflector: individual blanking mechanism) of the blanking aperture array member 204. Such blankers individually deflect (deflect by blanking) the passing electron beam 20.

The multiple beams 20a to 20e having passed through the blanking aperture array member 204 are reduced by the reducing lens 205 before traveling toward a hole in the center formed in the limiting aperture plate member 206. Here, the electron beam 20 deflected by the blanker of the blanking aperture array member 204 deviates from the position of the hole of the limiting aperture plate member 206 and is shielded by the limiting aperture plate member 206. On the other hand, the electron beam 20 that is not deflected by the blanker of the blanking aperture array member 204 passes, as shown in FIG. 1, through the hole in the center of the limiting aperture plate member 206. The blanking control is exercised by ON/OFF of the individual blanking mechanism to control ON/OFF of a beam. In this manner, the limiting aperture plate member 206 shields each beam deflected so as to be in a beam OFF state by the individual blanking mechanism. Then, a beam for one shot is formed for each beam by a beam formed between beam ON and beam OFF and having passed through the limiting aperture plate member 206. The multiple beams 20 having passed through the limiting aperture plate member 206 are focused by the objective lens 207 to become a pattern image of a desired reduction ratio and each beam (multiple beams 20 as a whole) having passed through the limiting aperture plate member 206 is deflected collectively in the same direction by the deflector 208 and targeted at the irradiation position of each beam on the target object 101. When, for example, the XY stage 105 moves continuously, the irradiation position of a beam is controlled by the deflector 208 so as to track the movement of the XY stage 105. The position of the XY stage 105 is measured by aiming a laser from the stage position detector 139 at the mirror 210 on the XY stage 105 and using a reflected light thereof. The multiple beams 20 emitted at a time are ideally arranged with pitches obtained by multiplying the arrangement pitch of the plurality of holes of the shaping aperture array member 203 by the above desired reduction ratio. The lithography apparatus 100 performs a pattern writing operation by the raster scan method by which the multiple beams 20 to be a shot beam are in turn emitted successively pixel by pixel by moving the beam deflection position by the deflector 208 while tracking the movement of the XY stage 105 during each tracking operation. When a desired pattern is written, a needed beam is controlled to beam ON by blanking control in accordance with the pattern.

Figure 5A:
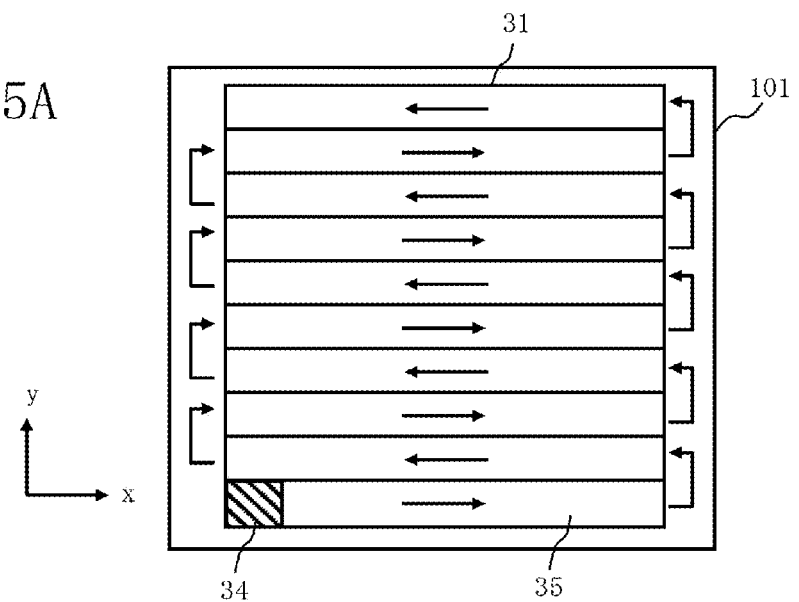
FIGS. 5A to 5C are conceptual diagrams illustrating an example of a pattern writing operation in Embodiment 1.
Figure 5B:
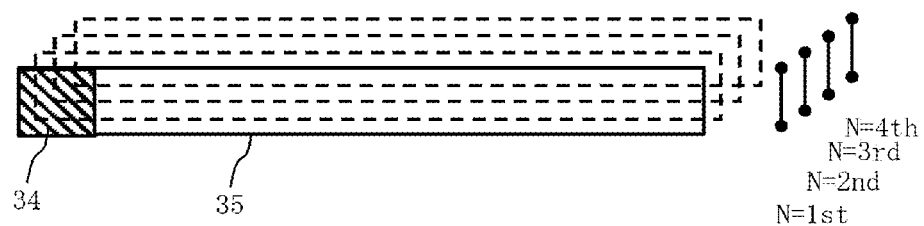
Figure 5C:
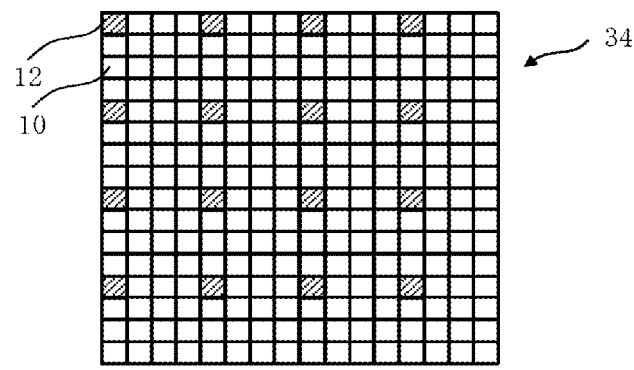

FIGS. 5A to 5C are conceptual diagrams illustrating an example of a pattern writing operation in Embodiment 1. As shown in FIG. 5A, the pattern writing region 31 of the target object 101 is virtually divided, for example, into a plurality of stripe regions 35 in a thin rectangular shape of a predetermined width in the y direction. Each of the stripe regions 35 becomes a pattern writing unit region. First, the XY stage 105 is moved to adjust such that an irradiation region 34 that can be irradiated with the multiple beams 20 at a time is positioned on the left end of the first stripe region 35 or in a position further to the left before pattern writing being started. When a pattern is written to the first stripe region 35, the XY stage 105 is moved in, for example, the −x direction to continue to write the pattern relatively in the x direction. The XY stage 105 is, for example, continuously moved at a predetermined speed. In Embodiment 1, when a pattern is written to each of the stripe regions 35, as shown in FIG. 5B, multiple pattern writing is performed by shifting in, for example, the y direction. In the example of FIG. 5B, a case of the multiplicity 4 (N=4) is shown. In each pass of multiple pattern writing (pattern writing process of each time), a pattern is written by shifting the position by the stripe y-direction width (also called a "stripe height")/N in the y direction.

Each stripe region is virtually divided into a plurality of mesh regions (pixels). In the example of FIG. 5C, a case in which a portion of the stripe region 35 divided into a plurality of pixels 10 is set as the irradiation region 34 for one shot is shown. The size of the pixel 10 is suitably, for example, a beam size or a size equal to the beam size or less. For example, the size is suitably set to about 10 nm. The pixel becomes the irradiation unit region per beam of multiple beams. In the example of FIG. 5C, 4×4 irradiation pixels 12 when 4×4 multiple beams are used as a shot are shown as an example. In a shot, a plurality of shot patterns as many as the number of the holes 22 is maximally formed at a time by multiple beams formed by passing through each of the holes 22 of the shaping aperture array member 203. Therefore, when irradiated with the multiple beams 20, the beam with which the same position is irradiated is different from pass to pass. In other words, of the holes 22 of m rows high (y direction)×n rows wide (x direction) (m, n≥2) of the shaping aperture array member 203, the same position is irradiated with a beam formed by the different hole 22 in each pass. Here, a case in which when a pattern is written to the one stripe region 35, pattern writing for each pass is also performed successively performed is shown, but the present embodiment is not limited to such an example. Pattern writing of all the stripe regions 35 may be performed in each pass such as performing pattern writing of all the stripe regions 35 in the second pass (N=2nd) after pattern writing of all the stripe regions 35 in the first pass (N=1st) is completed.

When writing a pattern to the target object 101 using the multiple beams 20, the multiple beams 20 to be a shot beam are in turn emitted successively pixel by pixel by moving the beam deflection position by the deflector 208 while tracking the movement in, for example, the x direction of the XY stage 105 during tracking operation. Then, which pixel on the target object 101 to irradiate with which beam of multiple beams is determined by a pattern writing sequence. Using beam pitches between beams adjacent in the x and y directions of multiple beams, a region of the beam pitch (x direction)×beam pitch (y direction) between beams adjacent in the x and y directions on the target object 101 surface includes a region (sub-pitch region) of n×n pixels. In the example of FIG. 5C, the region of the 4×4 pixels 10 become a sub-pitch region. If, for example, the XY stage 105 moves by the beam pitch (x direction) in the −x direction in one tracking operation, n pixels are written by one beam while shifting the irradiation position in the x direction or the y direction (or a slanting direction). Other n pixels in the region of the same n×n pixels are similarly written by a different beam from the above beam in the next tracking operation. In this manner, all pixels in one region of n×n pixels are written by mutually different beams in n tracking operations, each time n pixels. For other regions of n×n pixels in the irradiation region of multiple beams, similar operations are performed in the same period to similarly write a pattern. By repeating such a pattern writing operation in, for example, the stripe region unit, the same pixels can be written by multiple writing. In such a case, as described above, the same pixel is written by multiple writing using different beams by shifting the position in each pass.

A positional displacement of a different quantity could arise in the irradiation position on the target object 101 surface for each beam in the multiple beams 20. Thus, when multiple pattern writing is performed, the beam to be used is different from pass to pass even if the same pixel is irradiated with the beam and thus, the quantity of positional displacement is different from pass to pass if, for example, the same dose is used for irradiation. In Embodiment 1, therefore, the dose of the beam used for the same pixel is weighted in each pass in accordance with differences of the quantity of positional displacement for each beam.

Figure 6:
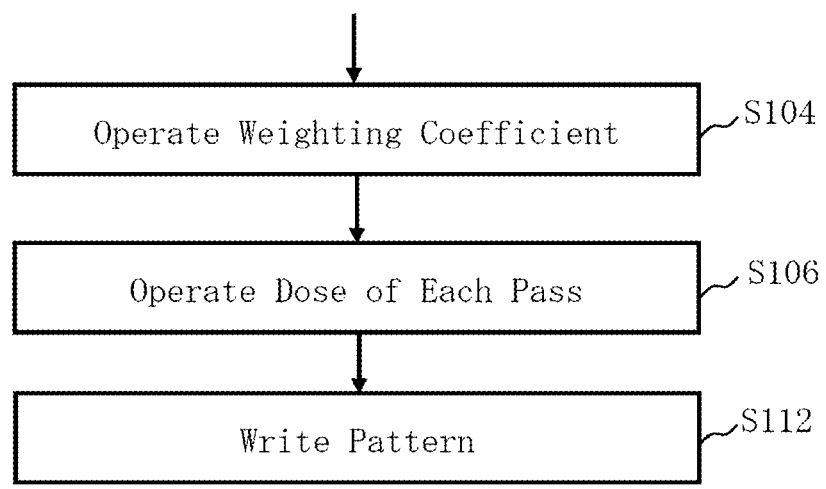
FIG. 6 is a flow chart showing principal processes of a pattern writing method according to Embodiment 1.

FIG. 6 is a flow chart showing principal processes of a pattern writing method according to Embodiment 1. In FIG. 6, a series of processes including a weighting coefficient operation process (S104), a dose operation process (S106) for each pass, and a pattern writing process (S112) are performed.

Figure 7:
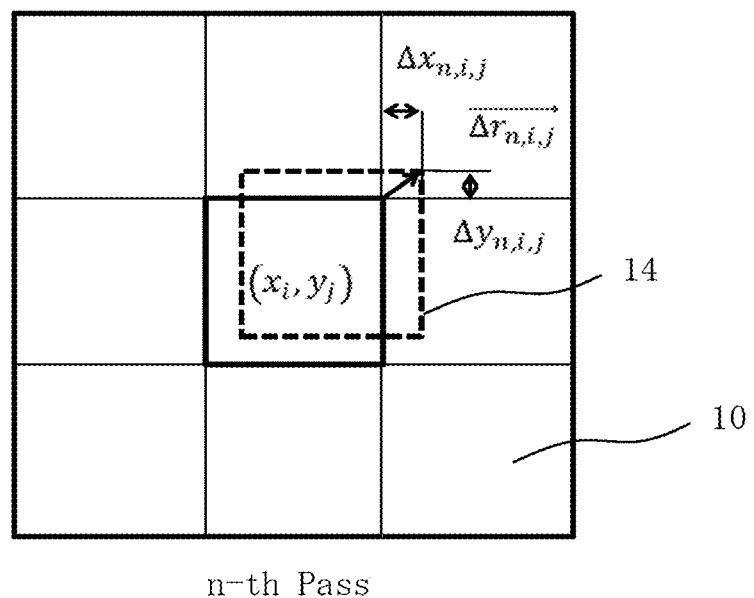
FIG. 7 is a diagram showing an example of a positional displacement of an irradiation position in Embodiment 1.

FIG. 7 is a diagram showing an example of a positional displacement of an irradiation position in Embodiment 1. Before starting a pattern writing process, the quantity of positional displacement for each pixel when the target object 101 surface is irradiated with multiple beams is measured in advance. Though not shown, irradiation positions 14 may be measured by arranging a measurement substrate coated with a resist on the stage 105 and irradiating the substrate with multiple beams. All the pixels 10 in a measurement region of the same size as that of the irradiation region 34 are written following a preset pattern writing sequence. Then, the beam irradiation position 14 of all the pixels 10 in the measurement region on the measurement substrate may be measured by using, for example, a position sensor. Because it is difficult to measure the quantity of positional displacement of each pixel after all the pixels 10 in one measurement region are written following a pattern writing sequence, each measurement region, after a plurality of measurement regions being set, may be irradiated with multiple beams by increasing the distance to an extent allowing measurement of the pixel position after irradiation. Then, pixels to be irradiated may be adjusted between measurement regions before combining irradiation pixels of a plurality of measurement regions such that all the pixels 10 in the measurement region can be considered to have been written. The quantity of positional displacement for each beam can be measured by determining a difference between the designed position of the pixel 10 and the measured irradiation position 14.

Actually, a pattern is written to the stripe region 35 and thus, likening the measurement region to inside the stripe region 35, quantities of positional displacement of beams in charge of irradiation of all the pixels 10 for the stripe region 35 of each pass for multiple pattern writing may be estimated. Alternatively, multiple pattern writing of all the pixels 10 for the stripe region 35 may be performed to measure the quantity of positional displacement of a beam in each pass of each pixel.

Then, the positional displacement data acquisition processing circuitry 50 inputs the obtained positional displacement data from outside the lithography apparatus 100 to store the data in the storage device 144. The example of FIG. 7 shows a case in which a positional displacement of the quantity of positional displacement of $\Delta x_{n,i,j}$ in the x direction and a positional displacement of the quantity of positional displacement of $\Delta y_{n,i,j}$ in the y direction arise for the irradiation position 14 of a beam with which the pixel 10 at coordinates $(x_i, y_j)$ is irradiated in the n-th pass. Thus, the positional displacement of a vector quantity $\Delta r_{n,i,j}$ arises. In Embodiment 1, the weighting coefficient is operated using a weighting function using the vector quantity $\Delta r_{n,i,j}$ to become such a quantity of positional displacement.

As the weighting coefficient operation process (S104), the weighting coefficient operation processing circuitry 54 (weighting coefficient operation processing circuitry) operates a plurality of weighting coefficients that assigns weights to doses of a plurality of different beams used for multiple pattern writing for each pixel 10 of pixels 10, the each pixel 10 being used as an irradiation unit region per beam of multiple beams 20. As described above, the stripe region 35 of the target object 101 is divided into the plurality of pixels 10. Then, in each pass of performing multiple pattern writing following a preset pattern writing sequence, with which beam of multiple beams each of the pixels 10 is irradiated is known. The weighting coefficient operation processing circuitry 54 reads data of the quantity of positional displacement $\Delta r_{n,i,j}$ of the beam in charge in each pass in multiple pattern writing of the multiplicity N from the storage device 144 for each pixel (i, j) and operates the weighting coefficient $w_{n,i,j}$ for the beam in charge in each pass by solving a weighting function shown in Formula (1) below. Each weighting coefficient $w_{n,i,j}$ of a plurality of passes is operated as an inverse ratio of the quantity of positional displacement $\Delta r_{n,i,j}$ of the relevant beam to the sum of the quantity of positional displacement $\Delta r_{n,i,j}$ of a plurality of different beams of all passes.

$$w_{n,i,j} = \frac{\frac{1}{|\overrightarrow{\Delta r_{n,i,j}}|}}{\sum_{n=1}^{N} \frac{1}{|\overrightarrow{\Delta r_{n,i,j}}|}} \quad (1)$$

The sum of the weighting coefficient $w_{n,i,j}$ for beam of each pass in multiple pattern writing for each pixel is, as shown in Formula (2) below, 1.

$$\sum_{n=1}^{N} w_{n,i,j} = 1 \quad (2)$$

As is evident from Formula (1), among beams of each pass, the value of the weighting coefficient $w_{n,i,j}$ of a beam increases, as a quantity of positional displacement of the beam becomes smaller, and conversely, the value of the weighting coefficient $w_{n,i,j}$ of a beam decreases, as a quantity of positional displacement of the beam becomes larger.

As the dose operation process (S106) for each pass, the dose operation processing circuitry 55 operates doses $D_{n,i,j}$ of a plurality of beams for all passes weighted by using the corresponding weighting coefficient $w_{n,i,j}$ of a plurality of weighting coefficients for all passes for each of the pixels 10. First, the ρ operation processing circuitry 57 reads pattern writing data from the storage device 140 and operates pattern area densities ρ of all pixels in each of the stripe regions 35 using the pattern defined for the pattern writing data. Here, base doses $D_0$ of the beam with which each pixel is irradiated is preset. Actually, the dose of a beam with which each pixel is irradiated is suitably determined in proportion to the calculated pattern area density ρ. For example, a dose $D_{total,i,j}$ for each pixel can be determined by $\rho D_0$. In addition, the dose for each pixel is suitably a corrected dose in which dimensional variations caused by a phenomenon causing dimensional variations such as the proximity effect, fogging effects, and loading effects (not shown) are corrected based on the dose. Thus, the dose $D_{total,i,j}$ for each pixel actually irradiated therewith may be different from pixel to pixel. The dose $D_{total,i,j}$ for each pixel is the total of doses in each pass of multiple pattern writing. Thus, the dose $D_{total,i,j}$ is distributed to each pass of the multiple pattern writing. When calculating the dose $D_{n,i,j}$ of each pass in the multiple pattern writing, the above weighting coefficient $w_{n,i,j}$ is used. The dose $D_{n,i,j}$ of the beam of the n-th pass in the multiple pattern writing for the pixel at coordinates (i, j) is defined by Formula (3) shown below. For example, the dose $D_{n,i,j}$ of the beam of the n-th pass in the multiple pattern writing is operated for each stripe region. Thus, the dose operation processing circuitry 55 operates the dose of a beam with which a pattern is written in the corresponding pass by multiplying the dose $D_{total,i,j}$ (total dose) obtained by adding doses of all passes in the multiple pattern writing by the weighting coefficient $w_{n,i,j}$ of the relevant pass.

$$D_{n,i,j} = w_{n,i,j} \cdot D_{total,i,j} \quad (3)$$

As the pattern writing process (S112), the writing mechanism 150 writes a pattern on the target object 101 using multiple beams in such a way that corresponding pixels are irradiated with a plurality of different beams of the weighted doses $D_{n,i,j}$. First, the data processing circuitry 58 converts the dose $D_{n,i,j}$ into a beam irradiation time and then, sorts the doses in the shot order following the pattern writing sequence. Then, sorted beam irradiation time array data is output to the deflection control circuit 130.

The deflection control circuit 130 outputs the beam irradiation time array data to each of the control circuits 41 for each shot. Then, under the control of the pattern writing control processing circuitry 60, the writing mechanism 150 performs pattern writing of the corresponding beam irradiation time for each shot of each beam. The operation of the writing mechanism 150 is as described above.

In Embodiment 1, the positional displacement of the relevant pixel is reduced by adjusting the dose of each pass when multiple pattern writing is performed. The dose $D_{n,i,j}$ increases, as a quantity of positional displacement of the beam used becomes smaller. Conversely, the dose $D_{n,i,j}$ decreases, as a quantity of positional displacement of the beam used becomes larger. Accordingly, the quantity of positional displacement of a pattern formed in each pixel after multiple pattern writing can be reduced.

Figure 8A:
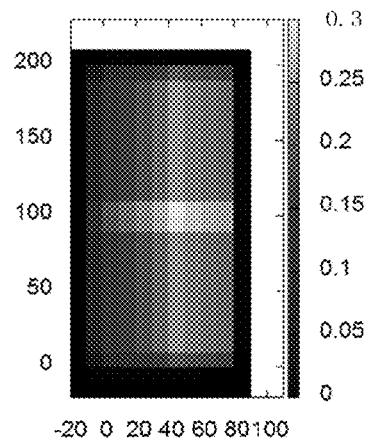
FIGS. 8A to 8D are diagrams showing examples of simulation results of a dose of each pass in Comparative Example of Embodiment 1.
Figure 8B:
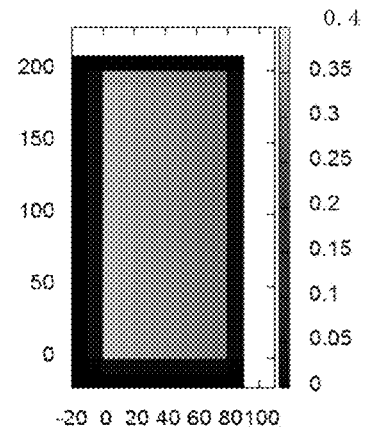
Figure 8C:
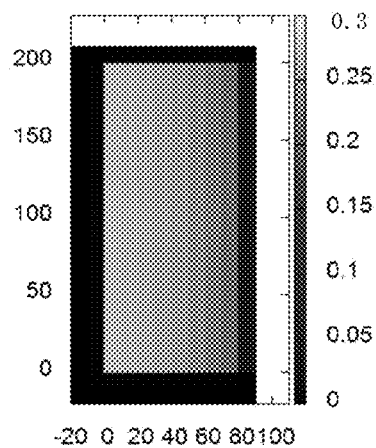
Figure 8D:
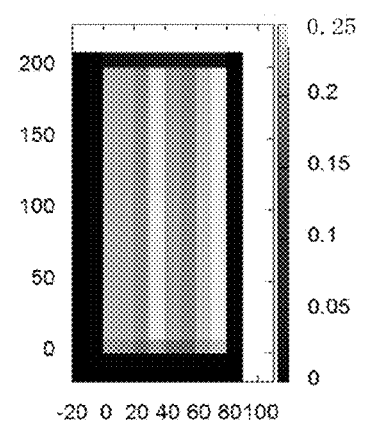

FIGS. 8A to 8D are diagrams showing examples of simulation results of a dose of each pass in Comparative Example of Embodiment 1. In the examples of FIGS. 8A to 8D, examples of the dose when multiple pattern writing of the multiplicity N=4 is performed are shown. Here, a simulation of determining the dose of each pixel for each pass when an evaluation pattern of 80 nm (x direction)×200 nm (y direction) is written by multiple writing by multiple beams is performed. In Comparative Example of FIGS. 8A to 8D, a case in which a technique of correcting the positional displacement by distributing a dose to surrounding pixels in the same pass without adjusting the dose between passes is used is shown. FIG. 8A shows the dose in the first pass. FIG. 8B shows the dose in the second pass. FIG. 8C shows the dose in the third pass. FIG. 8D shows the dose in the fourth pass. As shown in FIGS. 8A to 8D, the maximum dose in each pass is between 0.25 and 0.4 and thus, the difference of doses between passes is small. The dose shows a normalized value.

Figure 9A:
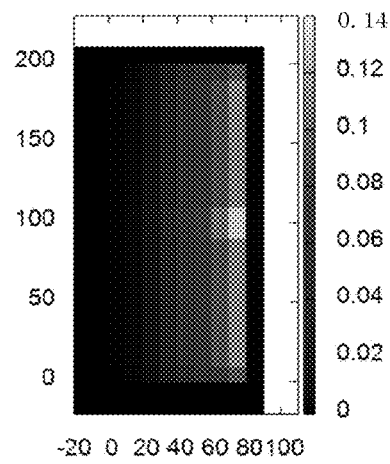
FIGS. 9A to 9D are diagrams showing examples of simulation results of the dose of each pass in Embodiment 1.
Figure 9B:
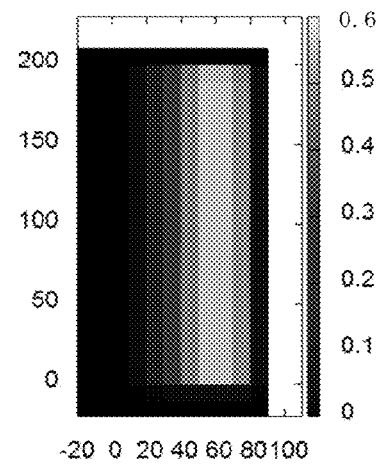
Figure 9C:
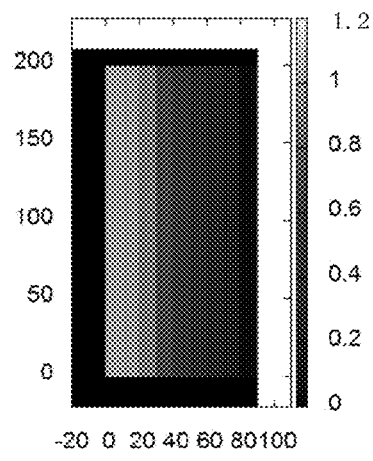
Figure 9D:
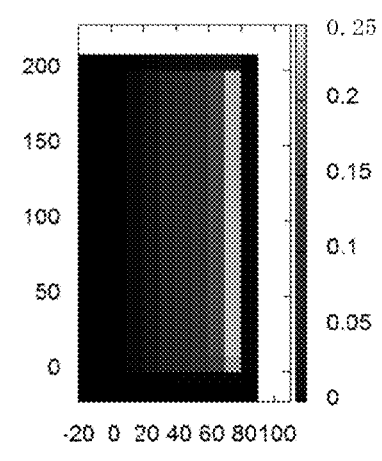

FIGS. 9A to 9D are diagrams showing examples of simulation results of the dose of each pass in Embodiment 1. In the examples of FIGS. 9A to 9D, like Comparative Example in FIGS. 8A to 8D, examples of the dose when multiple pattern writing of the multiplicity N=4 is performed are shown. Here, a simulation of determining the dose of each pixel for each pass when an evaluation pattern of 80 nm (x direction)×200 nm (y direction) is written by multiple writing by multiple beams is performed. In Comparative Example of FIGS. 9A to 9D, as described above, a case in which the dose is adjusted between passes is shown. Here, conversely, a dose is not distributed to surrounding pixels in the same pass. FIG. 9A shows the dose in the first pass. FIG. 9B shows the dose in the second pass. FIG. 9C shows the dose in the third pass. FIG. 9D shows the dose in the fourth pass. As shown in FIGS. 9A to 9D, the maximum dose in the third pass is much larger than in other passes. The dose shows a normalized value.

Figure 10A:
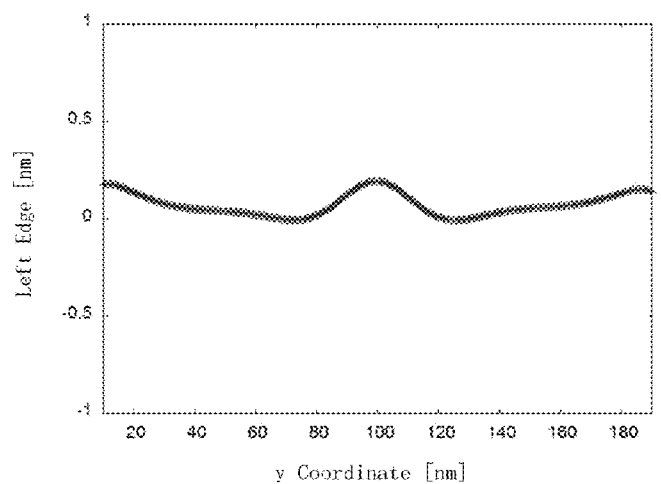
FIGS. 10A and 10B are diagrams showing examples of simulation results of a positional displacement in Embodiment 1 and Comparative Example.
Figure 10B:
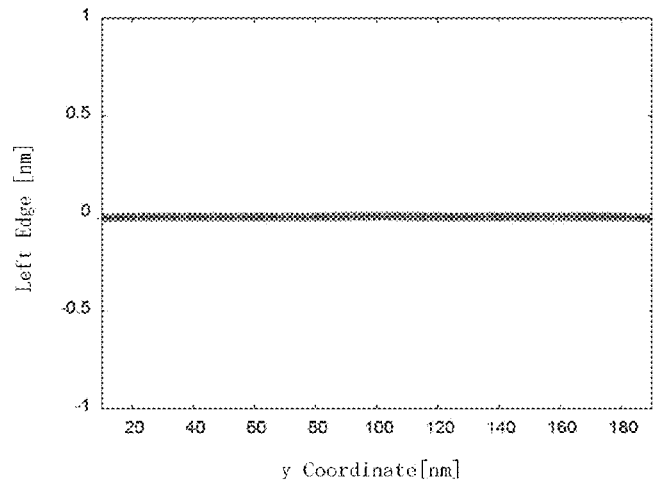

FIGS. 10A and 10B are diagrams showing examples of simulation results of a positional displacement in Embodiment 1 and Comparative Example. In FIGS. 10A and 10B, the vertical axis represents the quantity of positional displacement at the left end (x direction end) of an evaluation pattern and the horizontal axis represents the position in the y direction. FIG. 10A shows an example of simulation results of the quantity of positional displacement in Comparative Example. FIG. 10B shows an example of simulation results of the quantity of positional displacement in Embodiment 1. As is evident by comparing FIGS. 10A and 10B, the quantity of positional displacement can be made smaller by correcting the positional displacement by adjusting a dose between passes than by correcting the positional displacement by distributing a dose to surrounding pixels in the same pass.

Figure 11A:
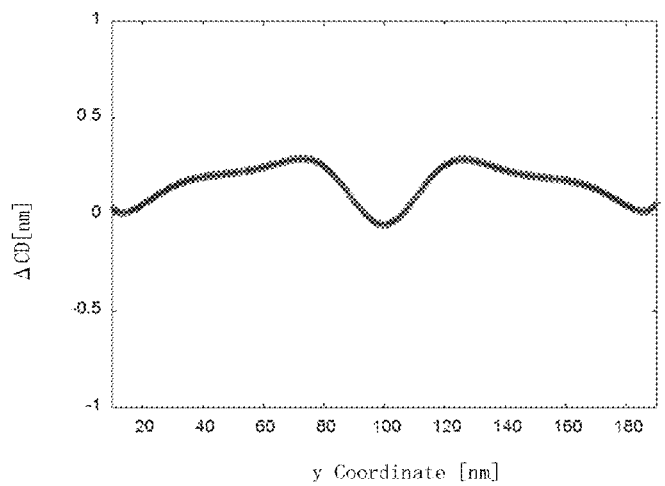
FIGS. 11A and 11B are diagrams showing examples of simulation results of a pattern linewidth dimensional displacement in Embodiment 1 and Comparative Example.
Figure 11B:
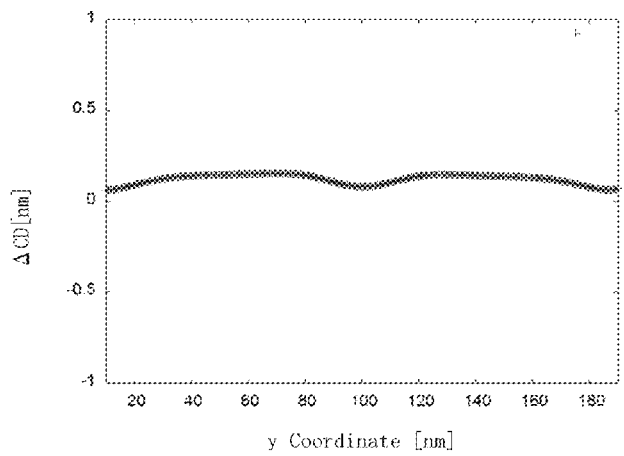

FIGS. 11A and 11B are diagrams showing examples of simulation results of a pattern linewidth dimensional displacement in Embodiment 1 and Comparative Example. In FIGS. 11A and 11B, the vertical axis represents a quantity of linewidth dimensional displacement $\Delta CD$ and the horizontal axis represents the position in the y direction. FIG. 11A shows an example of simulation results of $\Delta CD$ in Comparative Example. FIG. 11B shows an example of simulation results of $\Delta CD$ in Embodiment 1. A pattern is formed by a plurality of beam irradiated images being combined. As is evident by comparing FIGS. 11A and 11B, the quantity of dimensional displacement $\Delta CD$ of a resultant pattern can be made smaller by correcting the positional displacement by adjusting a dose between passes than by correcting the positional displacement by distributing a dose to surrounding pixels in the same pass.

According to Embodiment 1, as described above, positional displacement and dimensional displacement of a pattern formed by being irradiated with the multiple beams 20 containing a positionally-displaced beam can be corrected. Therefore, high-precision pattern writing can be performed.

Embodiment 2

In Embodiment 1, a case in which the dose of a beam in each pass is weighted by an inverse ratio of the quantity of positional displacement of a different beam in each pass is shown, but in Embodiment 1, a case in which the dose is biased to the positional displacement of a small beam may arise. The beam dose at a time is limited to avoid the influence of resist heating and the like. If the ratio of a beam dose for one pass becomes extremely large in multiple pattern writing, the limiting value of the beam dose for one shot may be exceeded. Thus, in Embodiment 2, a technique of adjusting the dose within the limiting value will be described.

Figure 12:
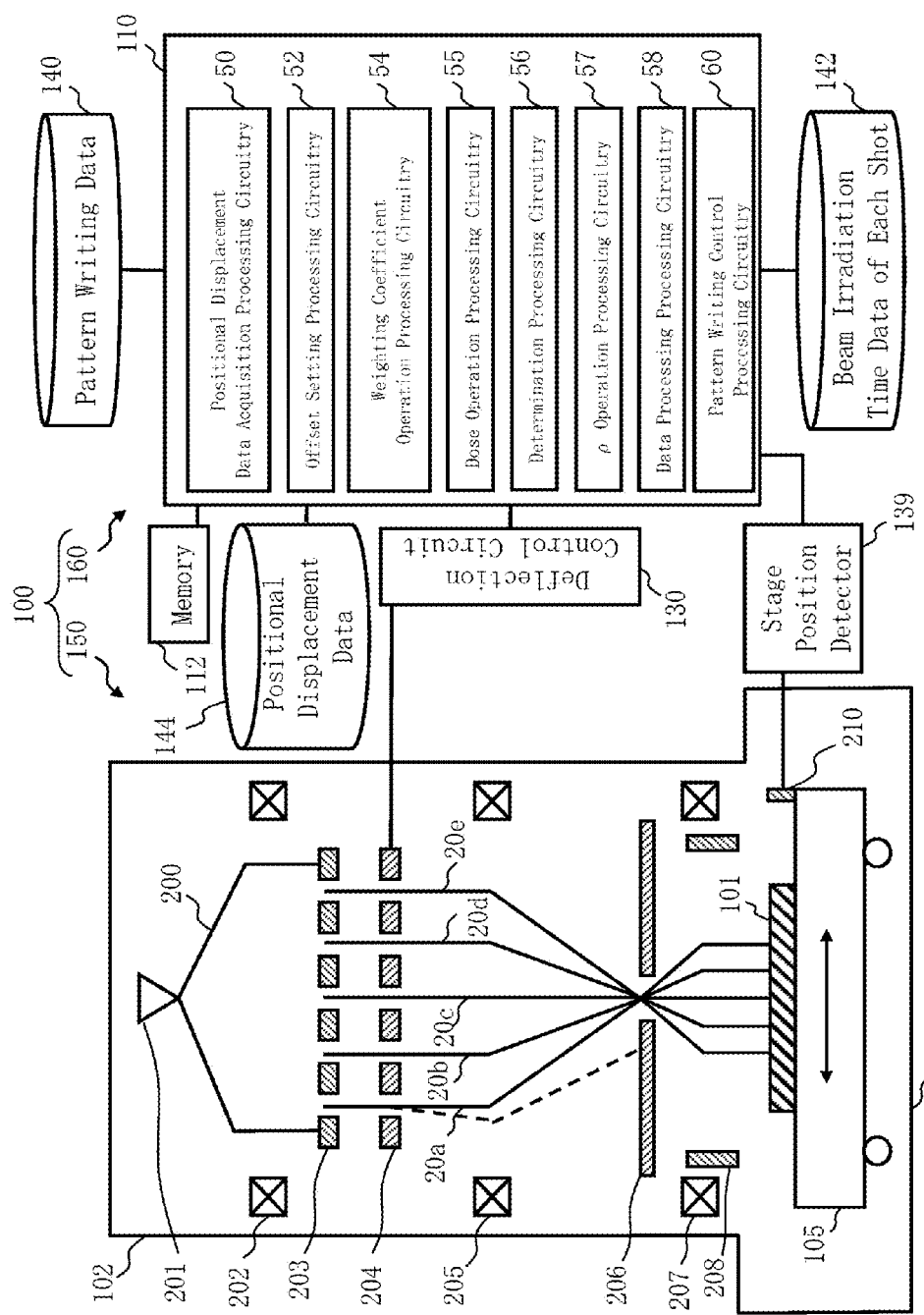
FIG. 12 is a conceptual diagram showing the configuration of the lithography apparatus according to Embodiment 2.

FIG. 12 is a conceptual diagram showing the configuration of the lithography apparatus according to Embodiment 2. FIG. 12 is the same as FIG. 1 except that an offset setting processing circuitry 52 and a determination processing circuitry 56 are added to the control computer 110. The positional displacement data acquisition processing circuitry 50, the offset setting processing circuitry 52, the weighting coefficient operation processing circuitry 54, the dose operation processing circuitry 55, the determination processing circuitry 56, the p operation processing circuitry 57, the data processing circuitry 58, and the pattern writing control processing circuitry 60 include an electric circuit, a quantum circuit, a computer, a processor, a circuit board, or a semiconductor device, for example. Each of the processing circuitries may use the common processing circuitry (same processing circuitry), or may use different processing circuitries (separated processing circuitries). Information input into or output from the positional displacement data acquisition processing circuitry 50, the offset setting processing circuitry 52, the weighting coefficient operation processing circuitry 54, the dose operation processing circuitry 55, the determination processing circuitry 56, the p operation processing circuitry 57, the data processing circuitry 58, and the pattern writing control processing circuitry 60 and information during operation are stored in the memory 112 each time.

Figure 13:
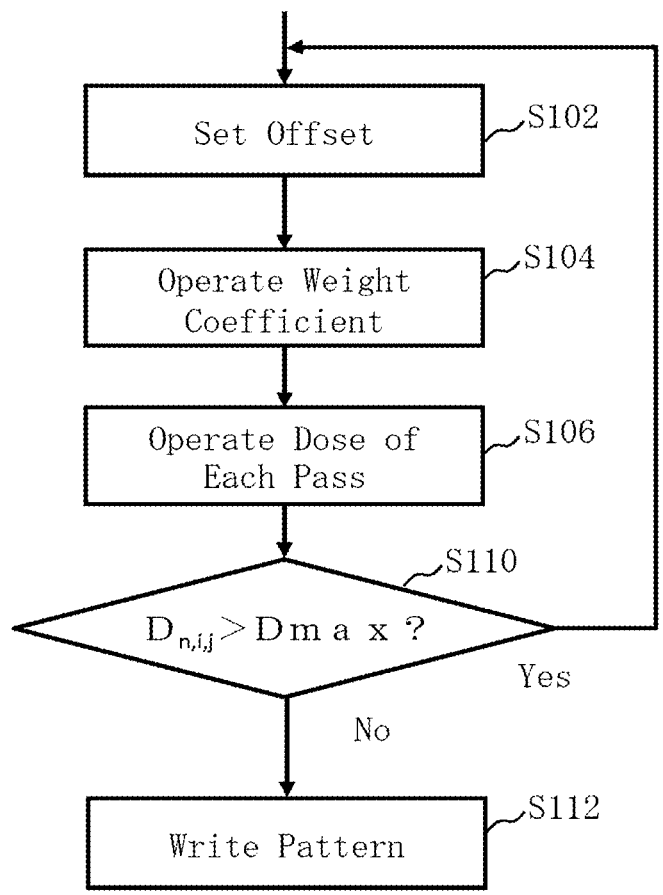
FIG. 13 is a flow chart showing principal processes of the pattern writing method according to Embodiment 2.

FIG. 13 is a flow chart showing principal processes of the pattern writing method according to Embodiment 2. FIG. 13 is the same as FIG. 6 except that an offset setting process (S102) is added before the weighting coefficient operation process (S104) and a determination process (S110) is added to between the dose operation process (S106) for each pass and the pattern writing process (S112). The contents not described below are the same as those in Embodiment 1.

As the offset setting process (S102), the offset setting processing circuitry 52 sets an offset value $\Delta r_{offset}$ to be a vector quantity to offset the quantity of positional displacement of a beam. The offset value $\Delta r_{offset}$ is suitably a value smaller than the beam size. Particularly, the offset value is suitably set to half the beam size or less. A plurality of different offset values $\Delta r_{offset}$ may be prepared in advance. Then, as will be described later, the offset value $\Delta r_{offset}$ could be reset and thus, the offset value $\Delta r_{offset}$ may be set in ascending order.

As the weighting coefficient operation process (S104), the weighting coefficient operation processing circuitry 54 (weighting coefficient operation processing circuitry) operates a plurality of weighting coefficients that assigns weights to doses of a plurality of different beams that write by multiple writing the pixels 10 using the offset value $\Delta r_{offset}$ for each group of the pixels 10 to be an irradiation unit region per beam of the multiple beams 20. As described above, the weighting coefficient operation processing circuitry 54 reads data of the quantity of positional displacement $\Delta r_{n,i,j}$ of the beam in charge in each pass in multiple pattern writing of the multiplicity N from the storage device 144 for each pixel (i, j) and operates the weighting coefficient $w_{n,i,j}$ for the beam in charge in each pass by solving a weighting function shown in Formula (4) below. Each weighting coefficient $w_{n,i,j}$ of a plurality of passes is operated as an inverse ratio of the sum of the quantity of positional displacement $\Delta r_{n,i,j}$ of the relevant beam and the offset value $\Delta r_{offset}$ to the sum of each sum of each of quantities of positional displacement $\Delta r_{n,i,j}$ of a plurality of different beams of all passes and the offset value $\Delta r_{offset}$.

$$w_{n,i,j} = \frac{\frac{1}{|\overrightarrow{\Delta r_{n,i,j}}| + |\overrightarrow{\Delta r_{offset}}|}}{\sum_{n=1}^{N}\left(\frac{1}{|\overrightarrow{\Delta r_{n,i,j}}| + |\overrightarrow{\Delta r_{offset}}|}\right)} \quad (4)$$

Incidentally, the sum of the weighting coefficient $w_{n,i,j}$ for beam of each pass in multiple pattern writing for each pixel is, as shown in Formula (2), similarly 1.

As is evident from Formula (4), among beams of each pass, the value of the weighting coefficient $w_{n,i,j}$ of a beam increases with a decreasing quantity of positional displacement and conversely, the value of the weighting coefficient $w_{n,i,j}$ of a beam decreases with an increasing quantity of positional displacement. However, a difference of values of the weighting coefficients $w_{n,i,j}$ can be made smaller than when the offset value $\Delta r_{offset}$ is not used. The dose operation process (S106) for each pass is the same as in Embodiment 1.

As the determination process (S110), the determination processing circuitry 56 determines whether the operated dose $D_{n,i,j}$ of beam of each pass in the multiple pattern writing exceeds the maximum dose Dmax. The maximum dose Dmax irradiated in each pass in the multiple pattern writing is preset. If the maximum dose is not exceeded, the process proceeds to the pattern writing process (S112). If the maximum dose is exceeded, the process returns to the offset setting process (S102). Then, in the offset setting process (S102), the offset value $\Delta r_{offset}$ is changed and each process from the weighting coefficient operation process (S104) to the determination process (S110) is repeated again. That is, each process from the offset setting process (S102) to the determination process (S110) is repeated until the dose $D_{n,i,j}$ does not exceed the maximum dose Dmax in the determination process (S110). Accordingly, the offset value $\Delta r_{offset}$ is set such that the doses $D_{n,i,j}$ of a plurality of different beams of all passes do not exceed the maximum dose Dmax. The contents of the pattern writing process (S112) are the same as those in Embodiment 1.

Figures 14A, 14B:
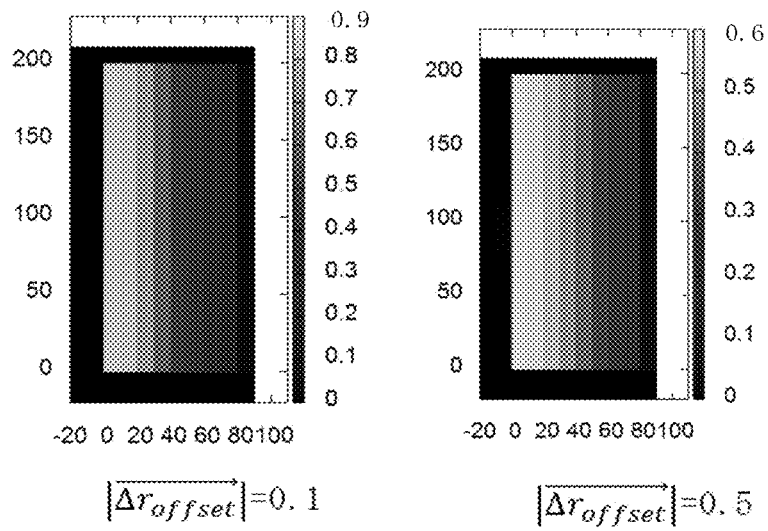
FIGS. 14A to 14D are diagrams showing examples of simulation results of the dose of one pass in Embodiment 2.
Figures 14C, 14D:
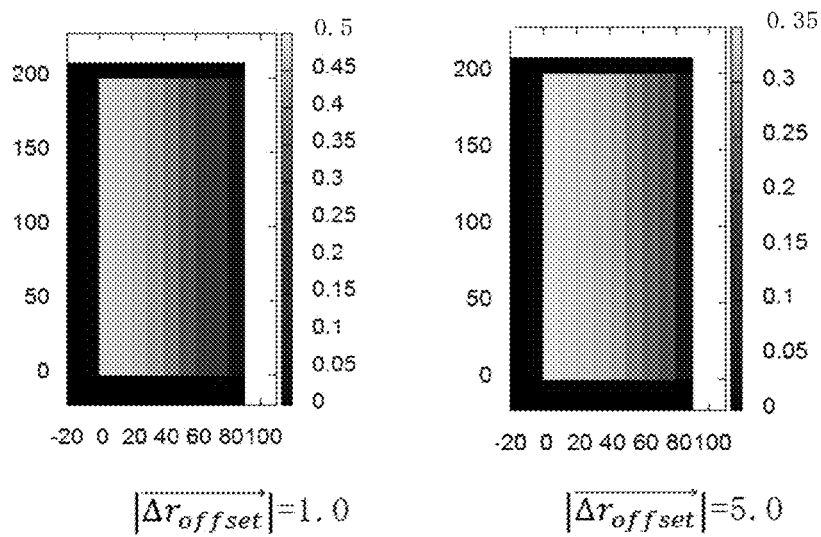

FIGS. 14A to 14D are diagrams showing examples of simulation results of the dose of one pass in Embodiment 2. The examples of FIGS. 14A to 14D show changes of dose when the offset value $\Delta r_{offset}$ of the dose in the third pass in FIGS. 9A to 9D is made variable. Other evaluation conditions are the same as those in FIGS. 9A to 9D. FIG. 14A shows a case in which the offset value $\Delta r_{offset}$ is 0.1. FIG. 14B shows a case in which the offset value $\Delta r_{offset}$ is 0.5. FIG. 14C shows a case in which the offset value $\Delta r_{offset}$ is 1.0. FIG. 14D shows a case in which the offset value $\Delta r_{offset}$ is 5.0. As shown in FIGS. 14A to 14D, the dose in the third pass decreases with an increasing offset value $\Delta r_{offset}$. In other words, the dependence (weighting) on a beam of the smallest quantity of positional displacement decreases.

Figure 15A:
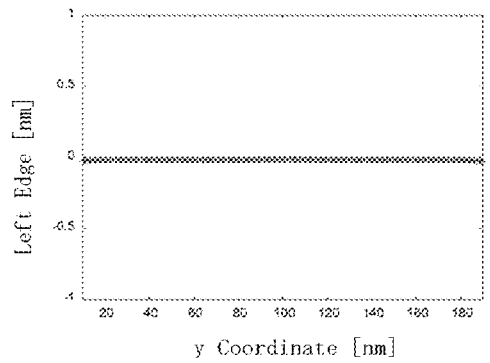
FIGS. 15A to 15D are diagrams showing examples of simulation results of the positional displacement when an offset value in Embodiment 2 is made variable.
Figure 15B:
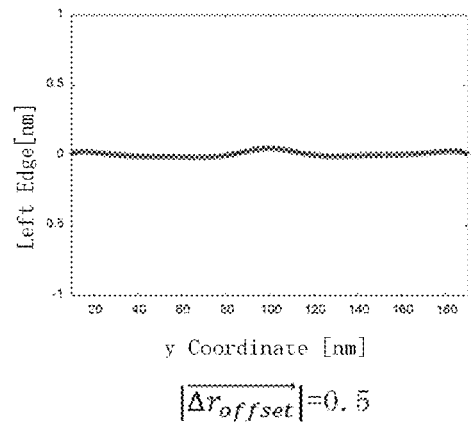
Figure 15C:
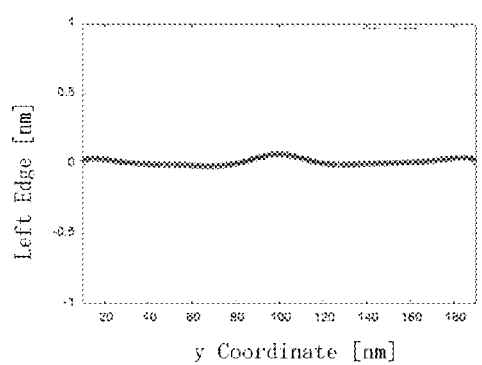
Figure 15D:
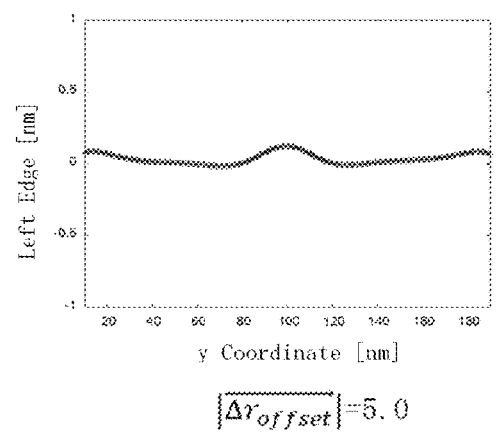

FIGS. 15A to 15D are diagrams showing examples of simulation results of the positional displacement when an offset value in Embodiment 2 is made variable. In FIGS. 15A to 15D, the vertical axis represents the quantity of positional displacement at the left end (x direction end) of an evaluation pattern and the horizontal axis represents the position in the y direction. FIG. 15A shows a case in which the offset value $\Delta r_{offset}$ is 0.1. FIG. 15B shows a case in which the offset value $\Delta r_{offset}$ is 0.5. FIG. 15C shows a case in which the offset value $\Delta r_{offset}$ is 1.0. FIG. 15D shows a case in which the offset value $\Delta r_{offset}$ is 5.0. As is evident by comparing FIGS. 15A to 15D, the quantity of positional displacement increases with an increasing offset value $\Delta r_{offset}$. In other words, the effect of correcting positional displacement decreases.

Figure 16A:
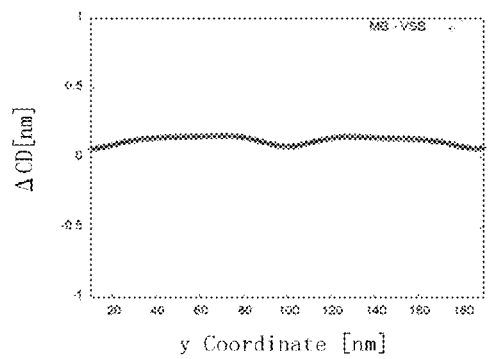
FIGS. 16A to 16D are diagrams showing examples of simulation results of the pattern linewidth dimensional displacement when the offset value in Embodiment 2 is made variable.
Figure 16B:
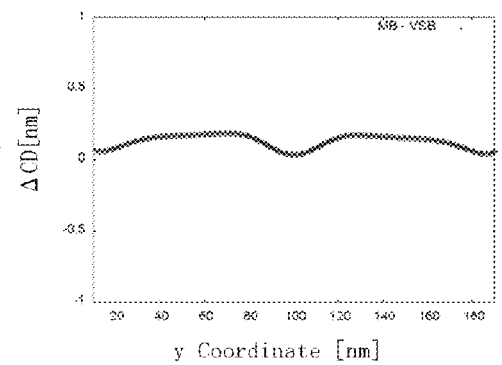
Figure 16C:
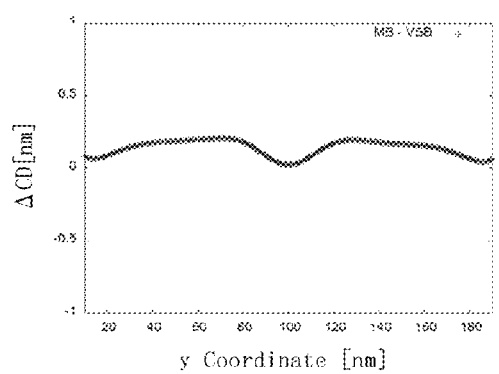
Figure 16D:
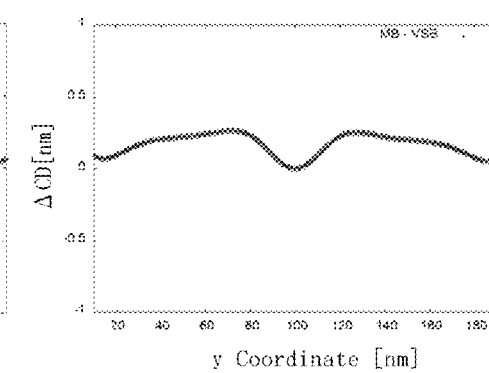

FIGS. 16A to 16D are diagrams showing examples of simulation results of the pattern linewidth dimensional displacement when the offset value in Embodiment 2 is made variable. In FIGS. 16A to 16D, the vertical axis represents the quantity of linewidth dimensional displacement $\Delta CD$ and the horizontal axis represents the position in the y direction. FIG. 16A shows a case in which the offset value $\Delta r_{offset}$ is 0.1. FIG. 16B shows a case in which the offset value $\Delta r_{offset}$ is 0.5. FIG. 16C shows a case in which the offset value $\Delta r_{offset}$ is 1.0. FIG. 16D shows a case in which the offset value $\Delta r_{offset}$ is 5.0. As is evident by comparing FIGS. 16A to 16D, the quantity of dimensional displacement $\Delta CD$ increases with an increasing offset value $\Delta r_{offset}$. In other words, the effect of correcting the quantity of dimensional displacement decreases.

Therefore, a smaller offset value $\Delta r$offset is suitably adjusted within a range in which the dose $D_{n,i,j}$ of beam of each pass does not exceed the limiting value (maximum dose Dmax).

According to Embodiment 2, as described above, positional displacement and dimensional displacement of a pattern formed by being irradiated with the multiple beams 20 containing a positionally-displaced beam can be corrected using a dose that does not exceed the limiting value (maximum dose Dmax). Therefore, more effective corrections can be made than in Embodiment 1.

In the foregoing, the embodiments have been described with reference to concrete examples. However, the present embodiment is not limited to the concrete examples.

In the above examples, a case in which a 10-bit control signal is input for control of each of the control circuits 41 is shown, but the number of bits may appropriately be set. For example, a 2-bit or a 3-bit to 9-bit control signal may be used. Incidentally, an 11-bit control signal or higher may also be used.

Parts of the apparatus configuration, the control method, and the like which are not needed to be explained directly for the explanation of the present invention are not described. However, a necessary apparatus configuration and a necessary control method can be appropriately selected and used. For example, a control unit configuration which controls the lithography apparatus 100 is not described. However, a necessary control unit configuration is appropriately selected and used, as a matter of course.

In addition, all multiple charged particle beam lithography apparatuses and multiple charged particle beam pattern writing methods including elements of the present invention and the design of which can appropriately be changed by a person skilled in the art are included in the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple charged particle beam lithography apparatus comprising:

a weighting coefficient operation processing circuitry configured to operate a plurality of weighting coefficients that assign weights to doses of a plurality of different beams used for multiple pattern writing for each pixel of pixels, the each pixel being used as an irradiation unit region per beam of multiple charged particle beams;

a dose operation processing circuitry configured to operate doses of the plurality of different beams weighted by using a corresponding weighting coefficient among the plurality of weighting coefficients for each of the pixels; and a writing mechanism, including a charged particle source, a deflector and a stage on which a target object is placed, configured to write a pattern on the target object using the multiple charged particle beams such that corresponding pixels are irradiated with the plurality of different beams of the doses weighted respectively.

2. The apparatus according to claim 1, wherein each of the plurality of weighting coefficients is operated as an inverse ratio of a quantity of positional displacement of a beam concerned to a sum of quantities of positional displacement of the plurality of different beams.

3. The apparatus according to claim 2, wherein the dose operation processing circuitry operates a dose of a beam that performs pattern writing for each pass of the multiple pattern writing by multiplying a total dose obtained by totaling the doses of all the passes of the multiple pattern writing by a weighting coefficient of a corresponding pass in the plurality of weighting coefficients.

4. The apparatus according to claim 2, wherein the plurality of weighting coefficients are operated such that a total of the plurality of weighting coefficients for each of the pixels becomes 1.

5. The apparatus according to claim 2, wherein the plurality of weighting coefficients is operated such that a corresponding weighting coefficient of a beam increases, as a quantity of positional displacement of the beam of the plurality of different beams that perform multiple pattern writing of the pixel becomes smaller, and a corresponding weighting coefficient of the beam decreases, as a quantity of positional displacement of the beam becomes larger.

6. The apparatus according to claim 1, wherein each of the plurality of weighting coefficients is operated as an inverse ratio of a sum of a quantity of positional displacement of a beam concerned and an offset value to a sum of each sum of each of quantities of positional displacement of the plurality of different beams and the offset value.

7. The apparatus according to claim 6, wherein a maximum dose irradiated in each pass of the multiple pattern writing is preset and the offset value is set such that the doses of the plurality of different beams do not exceed the maximum dose.

8. A multiple charged particle beam pattern writing method comprising:

operating a plurality of weighting coefficients that assign weights to doses of a plurality of different beams used for multiple pattern writing for each pixel of pixels, the each pixel being used as an irradiation unit region per beam of multiple charged particle beams;

operating doses of the plurality of different beams weighted by using a corresponding weighting coefficient among the plurality of weighting coefficients for each of the pixels; and writing a pattern on a target object using the multiple charged particle beams such that corresponding pixels are irradiated with the plurality of different beams of the doses weighted respectively.

9. The method according to claim 8, wherein each of the plurality of weighting coefficients is operated as an inverse ratio of a quantity of positional displacement of a beam concerned to a sum of quantities of positional displacement of the plurality of different beams.

10. The method according to claim 8, wherein each of the plurality of weighting coefficients is operated as an inverse ratio of a sum of a quantity of positional displacement of a beam concerned and an offset value to a sum of each sum of each of quantities of positional displacement of the plurality of different beams and the offset value.

* * * * *